United States Patent
Richard et al.

(10) Patent No.: US 6,408,506 B2
(45) Date of Patent: Jun. 25, 2002

(54) ELECTRICAL ENCLOSURE HAVING IMPROVED SEALING AND SHIELDING COMPONENT AND METHOD OF MANUFACTURE THEREOF

(75) Inventors: John Emil Richard, Rogers; William Joseph Nepsha, Blaine, both of MN (US); Timothy Lloyd Mullen, Hudson, WI (US); Thomas R. Hurney, Anoka, MN (US); Paul Rutherford, Jr., Straubenhardt (DE)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 09/795,597

(22) Filed: Feb. 28, 2001

Related U.S. Application Data

(62) Division of application No. 09/036,150, filed on Mar. 6, 1998, now Pat. No. 6,188,014.

(51) Int. Cl.[7] .............................. H01R 43/00
(52) U.S. Cl. ............... 29/825; 29/829; 29/840; 29/841
(58) Field of Search .................. 29/825, 827, 846, 29/841, 829

(56) References Cited

U.S. PATENT DOCUMENTS

| | | | |
|---|---|---|---|
| 3,299,574 A | | 1/1967 | Alexeff et al. |
| 4,857,668 A | * | 8/1989 | Buonanno |
| 4,900,877 A | * | 2/1990 | Dubrow et al. |
| 5,028,739 A | * | 7/1991 | Keyser et al. |
| 5,134,244 A | | 7/1992 | Balsells |
| 5,142,101 A | * | 8/1992 | Matsuzaki et al. |
| 5,216,840 A | | 6/1993 | Andrews |
| 5,465,528 A | | 11/1995 | Schinzel et al. |
| 5,804,762 A | * | 9/1998 | Jonee et al. |
| 5,889,229 A | * | 3/1999 | Sosnowski |
| 5,902,956 A | * | 5/1999 | Spies et al. |
| 6,188,014 B1 | * | 2/2001 | Richard et al. |
| 6,211,458 B1 | * | 4/2001 | Mitchell et al. |

FOREIGN PATENT DOCUMENTS

| | | |
|---|---|---|
| CA | 658663 | 2/1963 |
| EP | 0 275 171 A2 | 7/1988 |
| GB | 2 291 938 A | 2/1996 |
| GB | 2 304 467 A | 3/1997 |

OTHER PUBLICATIONS

"EMI Shielding for Military/Aerospace Electronics", *CHOMERICS Catalog*, 3 pages (Sep. 1996).
"Duosil® Composite Wire Mesh and Silicone or Fluorosilicone Rubber Strip", *Tecknit Catalog*, p. A–19 (1995).

* cited by examiner

Primary Examiner—Carl J. Arbes
(74) Attorney, Agent, or Firm—Merchant & Gould P.C.

(57) ABSTRACT

An electrical enclosure having an improved sealing and shielding component and a method of manufacturing such an enclosure is provided. In accordance with an embodiment of the invention, a wire mesh is positioned against the surface of the enclosure. While the wire mesh is being positioned against the enclosure surface, a foam is formed on the enclosure surface adjacent the wire mesh. The foam generally adheres to the enclosure surface and holds the wire mesh in place. In accordance with one aspect of the invention, the foam has a height equal to or greater than the height of the wire mesh. The improved sealing and shielding components can, for example, improve the sealing and shielding of the electrical enclosure as compared to conventional electrical enclosures. The present electrical enclosure may, for example, also reduce the cost of manufacturing electrical enclosures.

17 Claims, 3 Drawing Sheets

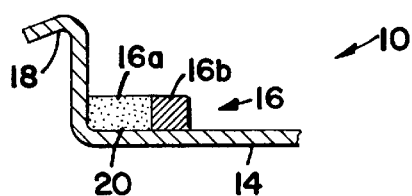
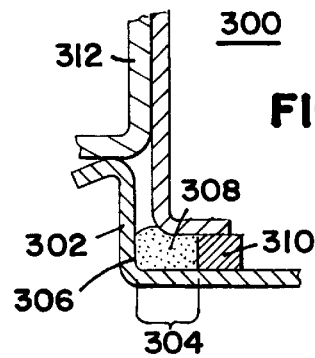
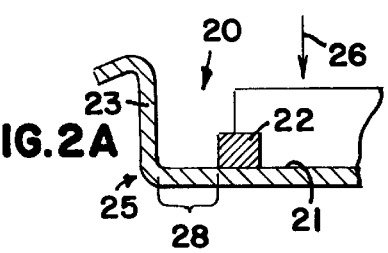
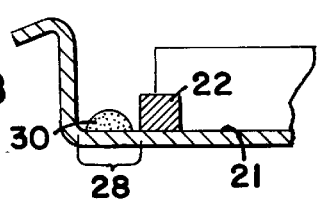
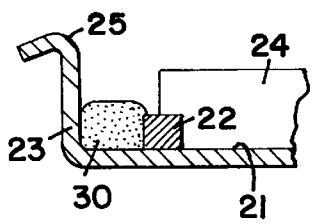
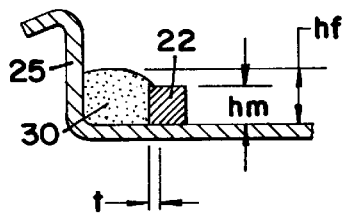

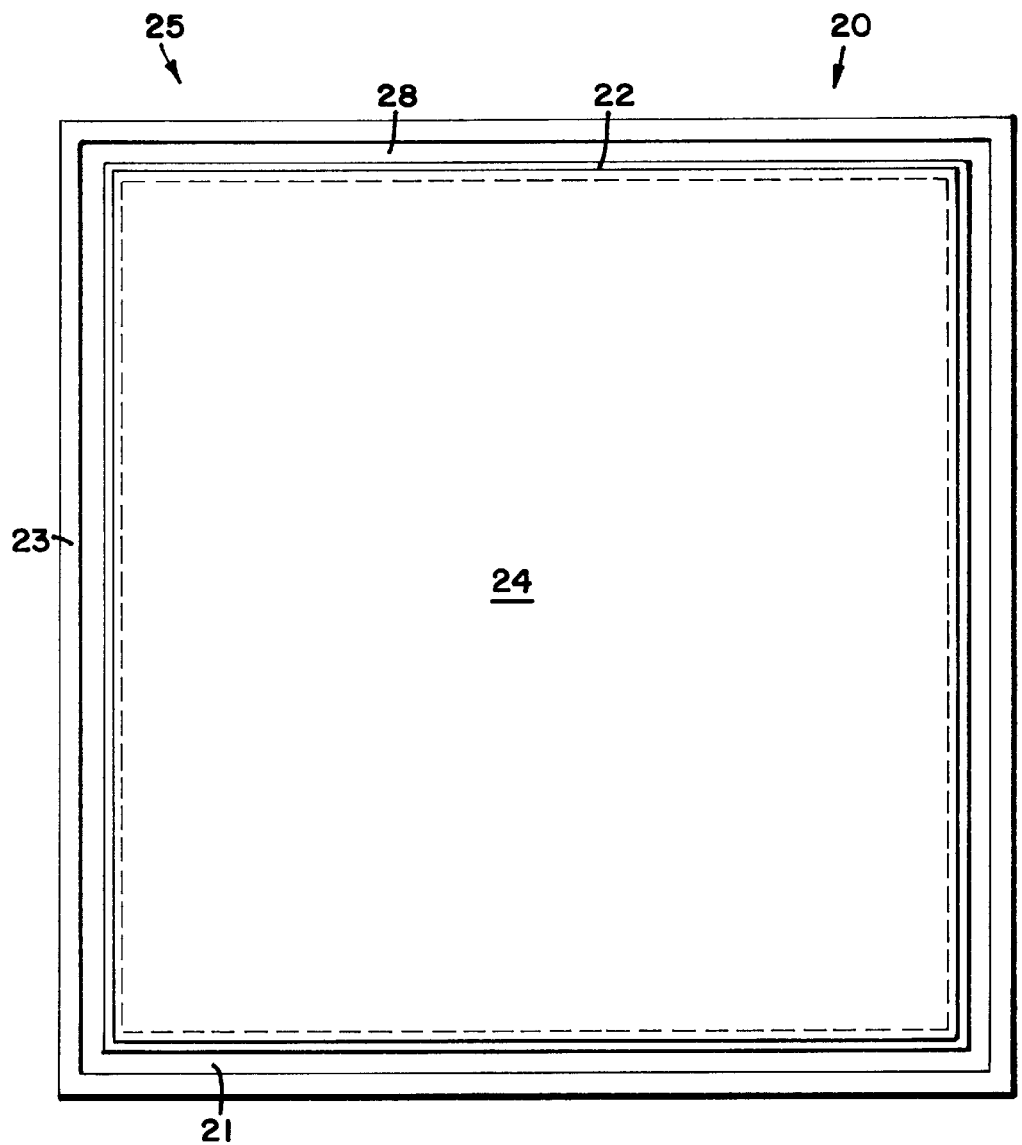

ELECTRICAL ENCLOSURE HAVING IMPROVED SEALING AND SHIELDING COMPONENT AND METHOD OF MANUFACTURE THEREOF

CROSS-REFERENCE TO RELATED APPLICATIONS

The present application is a division of U.S. Ser. No. 09/036,150, filed Mar. 6, 1998, U.S. Letters Pat. No. 6,188,014 dated Feb. 13, 2001, which application is incorporated herein by reference.

FIELD OF THE INVENTION

The present invention is generally directed to electrical enclosures and, more particularly, to an electrical enclosure having an improved sealing and shielding component and a method of manufacturing such an electrical enclosure.

BACKGROUND OF THE INVENTION

Electrical enclosures are widely-used to house electrical components, such as switches. A typical electrical enclosure is a steel structure which includes a base structure and a removable structure, such as a door or cover. The base structure and removable structure are generally secured together in order to form the enclosure which houses the electrical components. One important characteristic of an electrical enclosure is its ability to effectively electromagnetically shield the enclosed components. Another important feature is the enclosures ability to seal the housed electrical components from external conditions, such as dust, rain, snow, ice, etc.

In conventional electrical enclosures, the electrical enclosure is sealed and electromagnetically shielded using a preformed rubber gasket/wire mesh assembly (hereinafter preformed gasket/mesh assembly). A cross section of a conventional enclosure employing a preformed gasket/mesh assembly is shown in FIG. 1. The enclosure generally designated 10 includes a base structure 12 (shown in phantom) and a cover 14. A preformed gasket/mesh assembly 16 is disposed against an outer lip 18 of the cover 14. Typically the gasket/mesh assembly 16 runs adjacent the outer lip 18 about the entire perimeter of the cover 14. The preformed gasket/mesh assembly 16 typically includes a rubber gasket 16a bonded to a wire mesh 16b. The wire mesh 16b typically has a height h which is equal to or greater than the height of the rubber gasket 16a. In manufacturing the enclosure 10, an adhesive 20 is typically applied to the bottom of the rubber gasket 16a and the preformed gasket/mesh assembly 16 is laid down by hand against the outer lip 18 of the cover 14.

Conventional electrical enclosures such as those exemplified by FIG. 1 are typically associated with a number of shortcomings. For example, these conventional electrical enclosures often fail to adequately seal the enclosed electrical components under more harsh weather conditions. In addition, the assembling of conventional electrical enclosures is typically expensive. The high cost stems from both the high cost of manufacturing the preformed gasket/mesh assembly itself as well as the labor intensive manufacturing process used to adhere the preformed gasket/mesh assembly to the electrical enclosure.

SUMMARY OF THE INVENTION

The present invention generally provides an electrical enclosure having an improved sealing and shielding component and a method of manufacturing such an enclosure. The improved sealing and shielding component can, for example, improve the sealing of the electrical enclosure as compared to conventional electrical enclosures. The present electrical enclosure may, for example, also reduce the cost of manufacturing electrical enclosures.

In accordance with one embodiment of the invention, a method of manufacturing an electrical enclosure is provided. Consistent with this method, a wire mesh is positioned against the surface of the enclosure. While the wire mesh is positioned against the enclosure surface, a foam is formed on the enclosure surface adjacent the wire mesh. The foam generally adheres to the enclosure surface and holds the wire mesh in place. In accordance with one aspect of the invention, the foam has a height equal to or greater than the height of the wire mesh.

An electrical enclosure, consistent with an embodiment of the invention, includes a structure having a base surface with a perimeter and an edge around the perimeter. The enclosure further includes a wire mesh disposed on the base surface, the wire mesh being disposed apart from the edge of the structure so as to form a channel between the wire mesh and the edge. A foam is disposed in the channel and over a part of the wire mesh. The foam adheres to the base surface and holds the wire mesh in place. The electrical enclosure structure may, for example, be a cover of the electrical enclosure. In accordance with another aspect of the invention, the foam has a height which is greater than the height of the wire mesh.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 1 is a cross-sectional view of a conventional electrical enclosure;

FIGS. 2A–2D, 2A' and 2B' illustrate an exemplary process in accordance with one embodiment of the invention; and FIG. 3 is a partial cross-sectional view of an exemplary electrical enclosure in accordance with another embodiment of the invention.

Figure 2B:
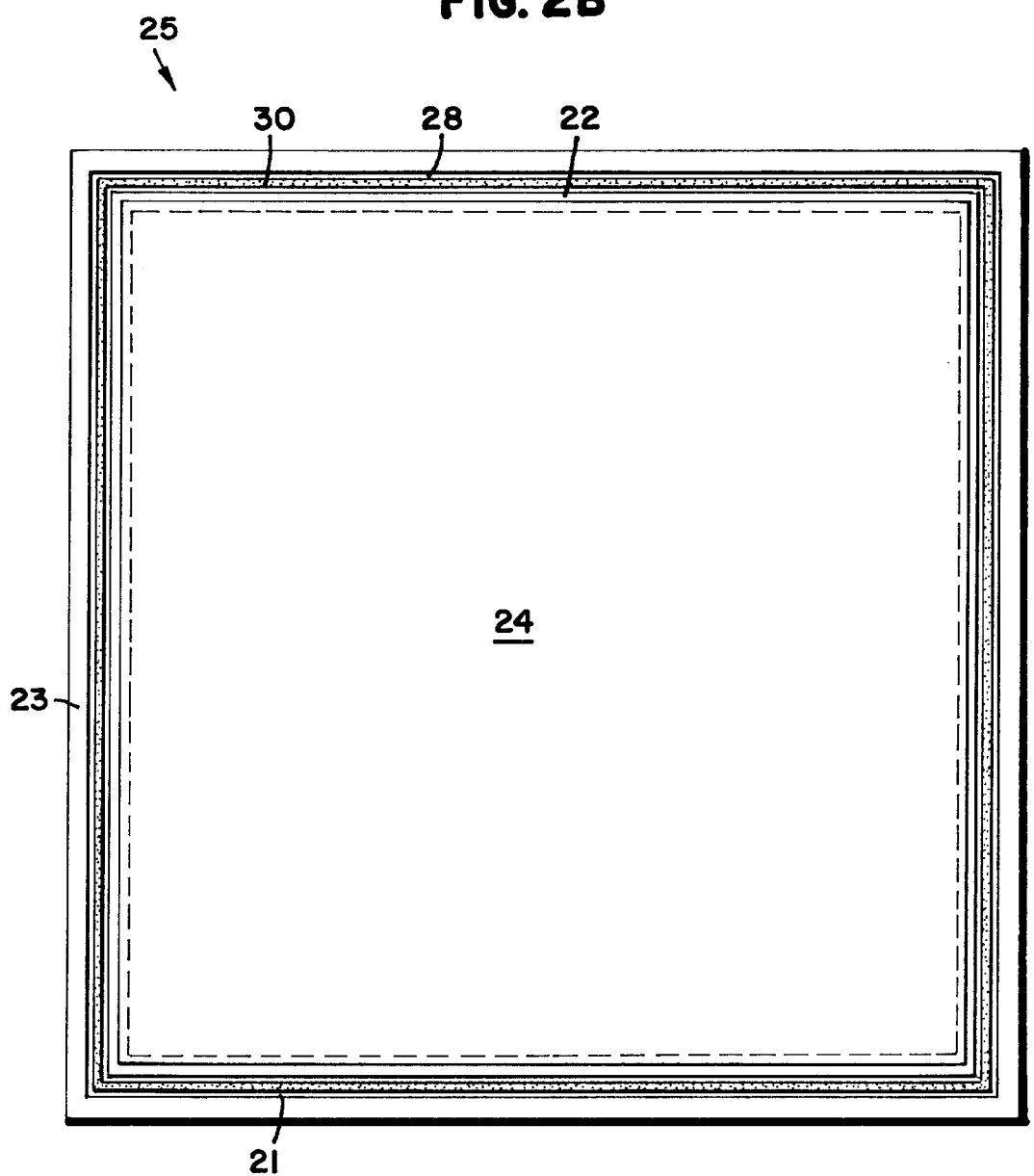

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is generally directed to electrical enclosures and in particular is directed to electrical enclosure which employ a sealing and shielding component. While the present invention is not so limited, a more detailed understanding of the present invention will be gained through a discussion of the drawings in connection with the examples provided below.

FIGS. 2A–2D and 2A' and 2B' illustrate an exemplary process for manufacturing an electrical enclosure having an improved sealing and shielding component in accordance with one embodiment of the invention. As shown in FIGS. 2A and 2A', a wire mesh 22 is positioned against a base surface 21 of a structure 25 of an electrical enclosure 20. The enclosure structure 25 may be formed of a number of different materials including, for example, sheet metal, stainless steel, composite alloys, etc. While the present invention is not so limited, the structure 25 may, for example, be a cover for the electrical enclosure 20. The cross-section of the wire mesh 22 can vary and may, for example, be square (as shown in FIG. 2A), rectangular, circular, etc. The wire mesh 22 may, for example, be formed by wrapping a sheet of wire mesh about itself. The pattern of the wire mesh can vary and may be, square or hexagonal, for example.

The wire mesh 22 is typically positioned around the base surface 21 and apart from an outer edge 23 of the enclosure structure 25. This positioning provides a channel 28 between the outer edge 23 and the wire mesh 22. The wire mesh 22 may be positioned against the surface 21 in a number of different manners. In the illustrated embodiment, the wire mesh 22 is positioned against the base surface 21 by applying a downward force 26 on a fixture 24. The fixture 24 may, for example, be a plate which is sized to contact the wire mesh 22 while providing access from above to the channel 28. Suitable fixture plates may be formed from a number of different materials, including, for example, metal. In some cases, the fixture 24 may include a fastening surface, such as barbs, Velcro™ hooks, or a magnetic surface, for example, disposed to contact the wire mesh 22 for facilitating the holding of the wire mesh relative to the fixture 24 and between the base surface 21 and the fixture 24.

While positioning the wire mesh 22 against the base surface 21, an initial volume of foam 30 is applied in the channel 28. The resultant structure is illustrated in FIGS. 2B and 2B'. The foam 30 may be applied (e.g., poured or dispensed) using, for example, well-known foam-in-place (FIP) techniques. The foam 30 is generally applied around the entire channel 28 and will be used to seal the interior of the electrical enclosure from external conditions. The foam 30 will expand as will be discussed more fully below. The initial volume of the foam 30 is suitably selected in consideration of the desired final volume of the foam and can vary with the type of foam and its expansion characteristics. The final volume of the foam may, for example, be selected to provide the foam 30 with a height which is greater than the height of the wire mesh 22, as will be discussed more fully below. Suitable foam materials include polyurethane, for example.

Prior to applying the foam 30, the enclosure structure 25 may be conditioned to prepare the structure for adhering to the foam 30. The particular type of conditioning and the timing of the conditioning can vary depending on the material of the enclosure structure 25 as well as the type of conditioning used. In one embodiment, the enclosure structure 25 is conditioned by roughening surface portions of the enclosure structure 25. The roughened surface portions typically include part or all of the base surface 21 in the channel 28. The roughened surface portions may further include portions of the base surface 21 outside of the channel 28 (e.g., surface portions under the wire mesh 22 or portions of the inner surface of the edge 23). The roughening may be done using, for example, a well-known abrasion technique. Moreover, roughening of the enclosure structure 25 may be done before or after pressing the wire mesh 22 against the base surface 21. In another embodiment, a primer is applied to the enclosure structure 25 to prepare the enclosure structure 25 for adhering to the foam 30. The primer may be applied before or after the wire mesh 22 has been positioned against the base surface 21. Generally, the primer is applied to the part or all of the base surface 21 in the channel 28 and may also be applied on the inner surface of the outer edge 23.

While the wire mesh 22 remains positioned against the base surface 21, the foam 30 is allowed to expand. The resultant structure is illustrated in FIG. 2C. As the foam 30 expands it generally presses against the wire mesh 22 and the outer edge 23 of the enclosure structure 25 and grows upward above the wire mesh 22. During this process, the foam 30 adheres to the base surface 21 as well as the outer edge 23. In addition, the foam 30 forms a bond with the wire mesh 22. In some embodiments, the foam 30 may expand between the wires in the wire mesh 22 to form the bond. Where the wire mesh 22 is denser, the foam may simply expand a short distance into the wire mesh 22 to form the bond.

The expanding time for the foam 30 while the wire mesh 22 is positioned is generally selected to allow the foam 30 to fully expand to a final volume. The invention however is not so limited. The foam 30 may, if desired, only be allowed to partially expand while the fixture 24 is in place. What is important is that the final foam product adheres to the base surface 21 and holds the wire mesh 22 and provides a desired height relative to the wire mesh 22. In the example embodiment, the foam 30 is allowed to expand to near or at its final volume with the fixture 24 in place. The length of time that the foam 30 is allowed to expand while the wire mesh 22 is positioned can vary depending on the type of foam used as well as the ambient conditions. Suitable expansion times range from about 15 to 30 minutes, and more typically about 20 minutes, for many applications.

The fixture 24 is then removed. The resultant structure is illustrated in FIG. 2D. After removing the fixture 24, some additional expansion of the foam 30 may follow in cases where the foam has not fully expanded. During the expansion process, a portion of the foam 30 may expand over the wire mesh 22. The amount t by which the foam 30 overlaps the wire mesh 22 can vary depending on the amount of expansion of the foam 30. The foam 30 may, for example, overlap the wire mesh 22 by an amount t ranging from about 0.01 to 0.05 inches.

The final height $h_f$ of the foam 30 is typically selected to provide adequate sealing depending on the conditions under which the electrical enclosure 20 is to be used. Generally the final height $h_f$ of the foam 30 is greater than or equal to the height $h_m$ of the wire mesh 22. The final foam height $h_f$ may, for example, exceed the wire mesh height $h_m$ by about 10 to 40%. In a particular embodiment, the final foam height $h_f$ exceeds the wire mesh height $h_m$ by about 15%.

The structure illustrated in FIG. 2D is also illustrative of the enclosure structure 25 prior to being secured to a second enclosure structure (e.g., a base structure of the enclosure housing electrical components). The illustrated structure of FIG. 2D generally includes the foam 30 and wire mesh 22 which together form a sealing and shielding component of the electrical enclosure 20.

Turning now to FIG. 3, there is illustrated a partial cross-sectional view of an exemplary electrical enclosure 300 incorporating an improved sealing and shielding component in accordance with one embodiment of the invention. The electrical enclosure 300 generally includes a cover piece 302 having a sealing and shielding component 304 adjacent an outer edge 306 of the cover piece 302. The sealing and shielding component 306 generally includes a foam 308 and a wire mesh 310 which are formed in a similar manner as discussed above with respect to FIGS. 2A–2D. The electrical enclosure 300 further includes a base structure 312 which is shown securely attached to the cover piece 302. When the base structure 312 and cover piece 302 are securely attached, the foam 308 compresses to allow both the cover piece 302 and the base structure 312 to electrically contact the wire mesh 310, thereby providing an electromagnetic shield of enclosed electrical components (not shown), and to allow the cover piece 302 and base structure 312 to compress the foam 308, thereby providing a tight seal between the two enclosure structures 302 and 312.

Using the above process, an electrical enclosure having an improved sealing and shielding component may be formed. This provides an electrical enclosure having an improved sealing capability as compared to conventional electrical enclosures. In addition, this can, for example, provide more cost efficient assembly of the electrical enclosure as compared to conventionally-manufactured electrical enclosures.

As noted above, the present invention is applicable to a number of different electrical enclosure which employ a sealing and shielding component. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method of manufacturing an electrical enclosure having an enclosure structure with a base surface and an outer lip about a perimeter of the base surface, comprising:
    pressing a fixture against a wire mesh to position the wire mesh against the base surface, wherein a channel is defined between the wire mesh and the outer lip of the enclosure structure;
    applying a foam in the channel while pressing the wire mesh against the base surface with the fixture; and
    removing the fixture, wherein the foam adheres to the base surface and holds the wire mesh in position.

2. The method of claim 1, further including conditioning at least part of the base surface prior to applying the foam.

3. The method of claim 2, wherein conditioning the enclosure surface includes applying a primer to at least the channel.

4. The method of claim 2, wherein conditioning the enclosure surface includes roughening at least part of the enclosure surface.

5. The method of claim 1, wherein applying the foam includes applying an initial volume of foam which subsequently expands to overlap at least part of the wire mesh and expands against the wire mesh to retain the wire mesh to the foam.

6. The method of claim 5, wherein the foam expands to a final volume having a height about 10 to 40% greater than the height of the wire mesh.

7. A method of manufacturing an electrical enclosure having an enclosure structure with a base surface and an outer lip about a perimeter of the base surface, comprising:
    pressing a wire mesh to position the wire mesh against the base surface, wherein a channel is defined between the wire mesh and the outer lip of the enclosure structure;
    applying foam in the channel while pressing the wire mesh against the base surface; wherein the foam adheres to the base surface and holds the wire mesh in position.

8. The method of claim 7, further including conditioning at least part of the base surface prior to applying the foam.

9. The method of claim 8, wherein conditioning the enclosure surface includes applying a primer to at least the channel.

10. The method of claim 8, wherein conditioning the enclosure surface includes roughening at least part of the enclosure surface.

11. The method of claim 7, wherein applying the foam includes applying an initial volume of foam which subsequently expands to overlap at least part of the wire mesh and expands against the wire mesh to retain the wire mesh to the foam.

12. The method of claim 11, wherein the foam expands to a final volume having a height about 10 to 40% greater than the height of the wire mesh.

13. The method of claim 7, wherein the foam forms a seal with the base surface and holds the wire mesh in place.

14. The method of claim 7, wherein the wire mesh comprises a length of electromagnetic shielding wire mesh.

15. A method of manufacturing an electrical enclosure having an enclosure structure with a base surface and an outer lip about perimeter of the base surface, comprising:
    pressing a length of wire mesh to position the wire mesh against the base surface, wherein a channel is defined between the wire mesh and the outer lip of the enclosure structure;
    applying a foam bead along a length of the channel while pressing the wire mesh against the base surface; wherein the foam adheres to and forms a seal against the base surface and holds the wire mesh in position.

16. The method of claim 15, wherein the wire mesh comprises a length of electromagnetic shielding wire mesh.

17. The method of claim 15, wherein the foam and wire mesh form a continuous seal around a periphery of length of the base surface.

* * * * *